(12) United States Patent
Choi

(10) Patent No.: US 6,965,145 B2
(45) Date of Patent: Nov. 15, 2005

(54) NON-VOLATILE MEMORY DEVICE

(75) Inventor: Kyu Hyun Choi, Cupertino, CA (US)

(73) Assignee: O2IC, Inc., Santa Clara, CA (US)

( * ) Notice: Subject to any disclaimer, the term of this patent is extended or adjusted under 35 U.S.C. 154(b) by 44 days.

(21) Appl. No.: 10/394,417

(22) Filed: Mar. 19, 2003

(65) Prior Publication Data

US 2003/0223288 A1    Dec. 4, 2003

Related U.S. Application Data

(60) Provisional application No. 60/366,046, filed on Mar. 19, 2002.

(51) Int. Cl.[7] .......................................... H01L 29/792
(52) U.S. Cl. ..................................... 257/326; 257/366
(58) Field of Search ............................. 257/324, 326, 257/316, 321, 365, 411, 366; 365/182

(56) References Cited

U.S. PATENT DOCUMENTS

| | | | |
|---|---|---|---|
| 4,193,128 A | 3/1980 | Brewer | |
| 4,271,487 A | 6/1981 | Craycraft et al. | |
| 4,462,090 A | 7/1984 | Iizuka | |
| 5,051,951 A | 9/1991 | Maly et al. | |
| 5,396,461 A | 3/1995 | Fukumoto | |
| 5,408,115 A * | 4/1995 | Chang | 257/324 |
| 5,619,470 A | 4/1997 | Fukumoto | |
| 5,646,885 A | 7/1997 | Matsuo et al. | |
| 5,703,388 A * | 12/1997 | Wang et al. | 257/315 |
| 5,851,881 A * | 12/1998 | Lin et al. | 438/261 |
| 5,946,566 A | 8/1999 | Choi | |
| 5,969,383 A * | 10/1999 | Chang et al. | 257/316 |
| 5,986,932 A | 11/1999 | Ratnakumar et al. | |
| 6,091,634 A | 7/2000 | Wong | |
| 6,118,157 A | 9/2000 | Bergemont | |
| 6,175,268 B1 | 1/2001 | Merrill | |
| 6,222,765 B1 | 4/2001 | Nojima | |

(Continued)

*Primary Examiner*—Mark V. Prenty
(74) *Attorney, Agent, or Firm*—Townsend and Townsend and Crew LLP

(57) ABSTRACT

A non-volatile memory device (hereinafter alternatively referred to device) includes a guiding gate that extends along a first portion of the device's channel length and a control gate that extends along a second portion of the device's channel length. The first and second portions of the channel length do not overlap. The guiding gate, which overlays the substrate above the channel region, is insulated from the semiconductor substrate in which the device is formed via an oxide layer. The control gate, which also overlays the substrate above the channel region, is insulated from the substrate via an oxide-nitride-oxide layer. The device includes a source terminal, a drain terminal, a guiding gate terminal, a control gate terminal, and a substrate terminal coupled to the semiconductor substrate in which the device is formed.

12 Claims, 4 Drawing Sheets

U.S. PATENT DOCUMENTS

| | | |
|---|---|---|
| 6,242,774 B1 * | 6/2001 | Sung ........................ 257/315 |
| 6,266,272 B1 | 7/2001 | Kirihata et al. |
| 6,285,575 B1 | 9/2001 | Miwa |
| 6,363,011 B1 | 3/2002 | Hirose et al. |
| 6,370,058 B1 | 4/2002 | Fukumoto |
| 6,388,293 B1 * | 5/2002 | Ogura et al. ................ 257/365 |
| 6,414,873 B1 | 7/2002 | Herdt |
| 6,426,894 B1 | 7/2002 | Hirano |
| 6,514,819 B1 | 2/2003 | Choi |
| 6,532,169 B1 | 3/2003 | Mann et al. |
| 6,556,487 B1 | 4/2003 | Ratnakumar et al. |
| 6,654,273 B2 | 11/2003 | Miwa et al. |
| 6,798,008 B2 * | 9/2004 | Choi ........................ 257/298 |
| 2003/0223288 A1 * | 12/2003 | Choi ........................ 365/200 |

* cited by examiner

NON-VOLATILE MEMORY DEVICE

CROSS-REFERENCES TO RELATED APPLICATIONS

The present application claims benefit of the filing date of U.S. provisional application No. 60/366,046 filed on Mar. 19, 2002, entitled "Integrated RAM and Non-Volatile DRAM Memory Cell Method And Structure," the entire content of which is incorporated herein by reference.

The present application is related to copending application Ser. No. 10/394,407, now U.S. Pat. No. 6,798,008, issued Sep. 28, 2004, entitled "Non-Volatile Dynamic Random Access Memory," filed contemporaneously herewith, assigned to the same assignee, and incorporated herein by reference in its entirety.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention relates to semiconductor integrated circuits. More particularly, the invention provides a semiconductor memory that has integrated non-volatile and dynamic random access memory cells. Although the invention has been applied to a single integrated circuit device in a memory application, there can be other alternatives, variations, and modifications. For example, the invention can be applied to embedded memory applications, including those with logic or micro circuits, and the like.

Semiconductor memory devices have been widely used in electronic systems to store data. There are generally two types of memories, including non-volatile and volatile memories. The volatile memory, such as a Static Random Access Memory (SRAM) or a Dynamic Random Access Memory (DRAM), loses its stored data if the power applied has been turned off. SRAMs and DRAMs often include a multitude of memory cells disposed in a two dimensional array. Due to its larger memory cell size, an SRAM is typically more expensive to manufacture than a DRAM. An SRAM typically, however, has a smaller read access time and a lower power consumption than a DRAM. Therefore, where fast access to data or low power is needed, SRAMs are often used to store the data.

Non-volatile semiconductor memory devices are also well known. A non-volatile semiconductor memory device, such as flash Erasable Programmable Read Only Memory (Flash EPROM), Electrically Erasable Programmable Read Only Memory (EEPROM) or, Metal Nitride Oxide Semiconductor (MNOS), retains its charge even after the power applied thereto is turned off. Therefore, where loss of data due to power failure or termination is unacceptable, a non-volatile memory is used to store the data.

Unfortunately, the non-volatile semiconductor memory is typically slower to operate than a volatile memory. Therefore, where fast store and retrieval of data is required, the non-volatile memory is not typically used. Furthermore, the non-volatile memory often requires a high voltage, e.g., 12 volts, to program or erase. Such high voltages may cause a number of disadvantages. The high voltage increases the power consumption and thus shortens the lifetime of the battery powering the memory. The high voltage may degrade the ability of the memory to retain its charges-due to hot-electron injection. The high voltage may cause the memory cells to be over-erased during erase cycles. Cell over-erase results in faulty readout of data stored in the memory cells.

The growth in demand for battery-operated portable electronic devices, such as cellular phones or personal organizers, has brought to the fore the need to dispose both volatile as well as non-volatile memories within the same portable device. When disposed in the same electronic device, the volatile memory is typically loaded with data during a configuration cycle. The volatile memory thus provides fast access to the stored data. To prevent loss of data in the event of a power failure, data stored in the volatile memory is often also loaded into the non-volatile memory either during the configuration cycle, or while the power failure is in progress. After power is restored, data stored in the non-volatile memory is read and stored in the non-volatile memory for future access. Unfortunately, most of the portable electronic devices may still require at least two devices, including the non-volatile and volatile, to carry out backup operations. Two devices are often required since each of the devices often rely on different process technologies, which are often incompatible with each other.

To increase the battery life and reduce the cost associated with disposing both non-volatile and volatile memory devices in the same electronic device, non-volatile SRAMs and non-volatile DRAMs have been developed. Such devices have the non-volatile characteristics of non-volatile memories, i.e., retain their charge during a power-off cycle, but provide the relatively fast access times of the volatile memories. As merely an example, FIG. 1 is a transistor schematic diagram of a prior art non-volatile DRAM 10. Non-volatile DRAM 10 includes transistors 12, 14, 16 and EEPROM cell 18. The control gate and the drain of EEPROM cell 18 form the DRAM capacitor. Transistors 12 and 14 are the DRAM transistors. Transistor 16 is the mode selection transistor and thus selects between the EEPROM and the DRAM mode.

FIG. 2 is a transistor schematic diagram of a prior art non-volatile SRAM 40. Non-volatile SRAM 40 includes transistors 42, 44, 46, 48, 50, 52, 54, 56, resistors 58, 60 and EEPROM memory cells 62, 64. Transistors 48, 50, 52, 54 and resistors 58, 60 form a static RAM cell. Transistors 42, 44, 46, 56 are select transistors coupling EEPROM memory cells 62 and 64 to the supply voltage Vcc and the static RAM cell. Transistors 48 and 54 couple the SRAM memory cell to the true and complement bitlines BL and $\overline{BL}$.

EEPROM 18 of non-volatile DRAM cell 10 (FIG. 1) and EEPROM 62, 64 of non-volatile SRAM cell 40 (FIG. 2) consume relatively large amount of current and thus shorten the battery life. Accordingly, a need continues to exist for a relatively small non-volatile memory device that, among other things, is adapted for use in a non-volatile SRAM or DRAM and consume less power than those known in the prior art.

While the invention is described in conjunction with the preferred embodiments, this description is not intended in any way as a limitation to the scope of the invention. Modifications, changes, and variations, which are apparent to those skilled in the art can be made in the arrangement, operation and details of construction of the invention disclosed herein without departing from the spirit and scope of the invention.

BRIEF SUMMARY OF THE INVENTION

In accordance with the present invention, a non-volatile memory device (hereinafter alternatively referred to device) includes a guiding gate that extends along a first portion of the device's channel length and a control gate that extends along a second portion of the device's channel length. The first and second portions of the channel length do not overlap. The guiding gate, which overlays the substrate above the channel region, is insulated from the semiconductor substrate in which the device is formed via an oxide layer. The control gate, which also overlays the substrate above the channel region, is insulated from the substrate via an oxide-nitride-oxide layer.

In some embodiment of the present invention, the thickness of the oxide layer formed above the guiding gate is greater than the thickness of the oxide layer formed above the control gate. In other embodiments, the thickness of the oxide layer formed above the control gate is greater than the thickness of the oxide layer formed above the guiding gate.

The device includes five terminals, namely a source terminal coupled to the device's source region, a drain terminal coupled to the device's drain region, a guiding gate terminal coupled to the device's guiding gate, a control gate terminal coupled to the device's control gate, and a substrate terminal coupled to the semiconductor substrate in which the device is formed.

To program the device, a first voltage is applied between the control gate terminal and the substrate terminal, a second voltage is applied between the guiding gate terminal and the substrate terminal, and a third voltage is applied between the drain and source terminals. The application of these voltages causes two non-overlapping channel regions to be formed in the substrate. Subsequently, a channel connecting the source to drain region is formed in the substrate. As the electrons drift from source to the drain due to the established electric filed, the electrons tunnel through or are injected in the oxide layer and are trapped in the nitride layer due to hot electron injection. The injected electrons remain trapped in the nitride layer even after power is turned off.

To erase the device after it is programmed, a negative voltage is applied between the control gate terminal and the substrate terminal, a positive voltage is applied between the drain and substrate terminals and the guiding gate terminal is left floating or is coupled to the ground potential. The application of these voltages causes the electrons trapped in the nitride layer to tunnel through the oxide layer—due to Fowler-Nordheim tunneling—and return to the substrate 206 and/or holes to tunnel through the oxide layer and be trapped in the nitride layer to neutralize the trapped electrons.

To read the data stored in the device, relatively small voltages are applied to each of the drain, control and guiding gates. The application of these voltages causes a current to flow from the source to the drain region. The size of this current depends on whether the device is programmed or not.

The accompanying drawings, which are incorporated in and form part of the specification, illustrate embodiments of the invention and, together with the description, sever to explain the principles of the invention.

DETAILED DESCRIPTION OF THE INVENTION

According to the present invention, an improved non-volatile memory device and method is provided. Although the invention has been applied to a single integrated circuit device in a memory application, there can be other alternatives, variations, and modifications. For example, the invention can be applied to embedded memory applications, including those with logic or microcircuits, and the like.

Figure 1:
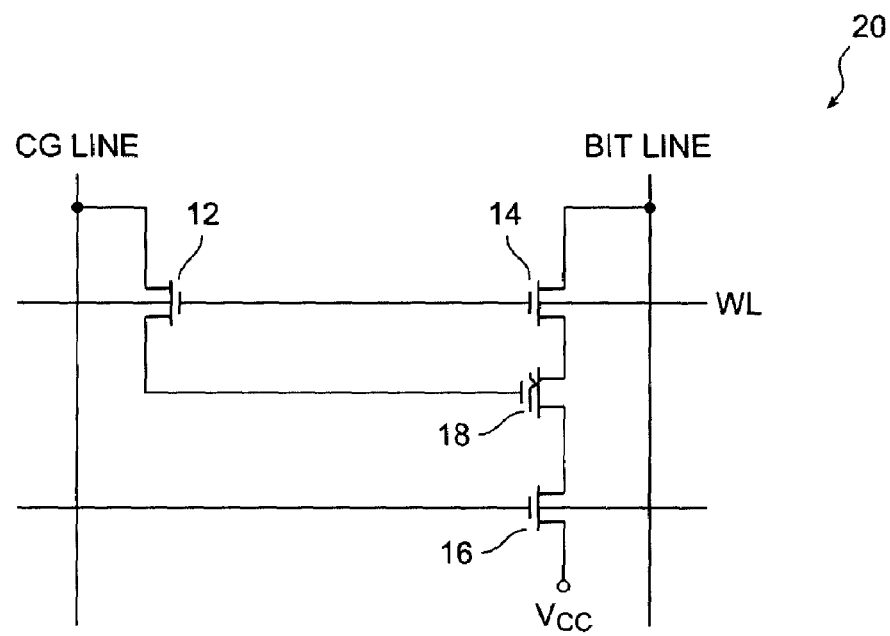
FIG. 1 is a simplified transistor schematic diagram of a non-volatile DRAM, as known in the prior art.
Figure 2:
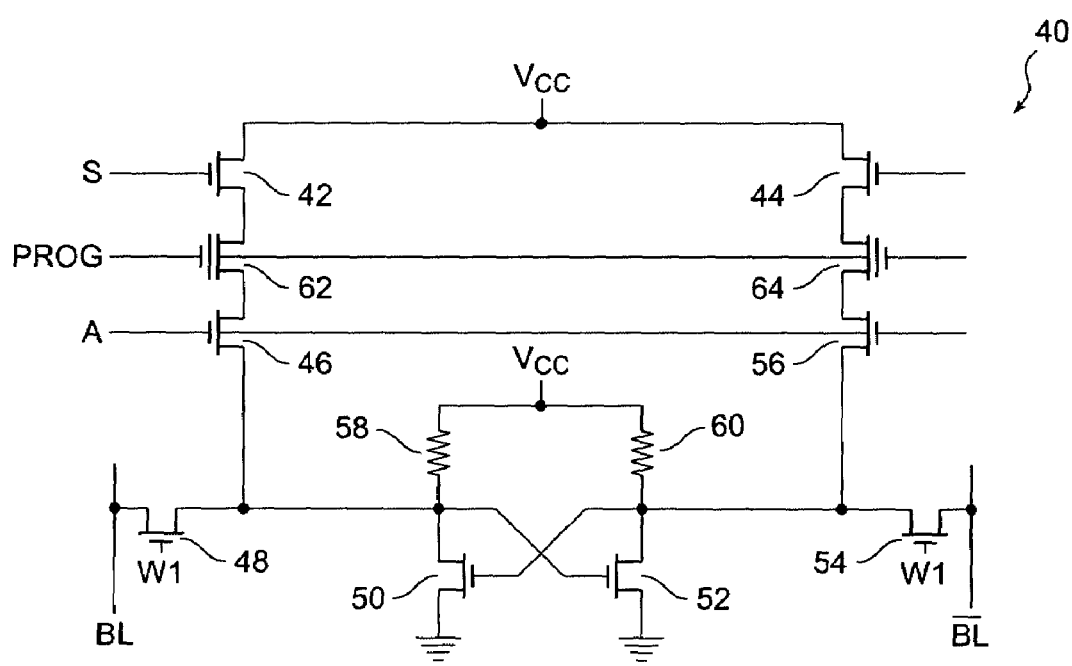
FIG. 2 is a simplified transistor schematic diagram of a non-volatile SRAM, as known in the prior art.
Figure 3:
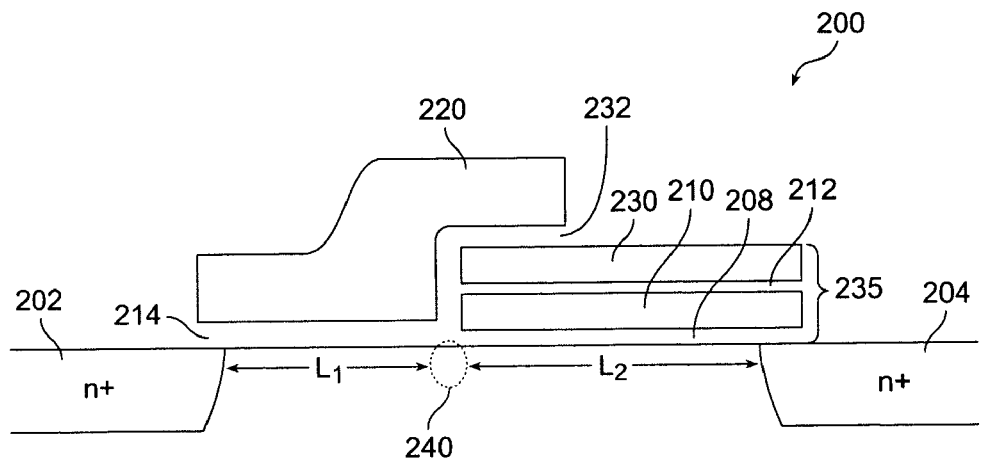
FIG. 3 is a cross-sectional view of a non-volatile memory device, in accordance with one embodiment of the present invention.

FIG. 3 is a cross-sectional view of non-volatile memory device 200 (hereinafter alternatively referred to as device 200) in accordance with a first embodiment of the present invention. Device 200 includes, in part, a guiding gate 220, a control gate 230, n-type source region 202, n-type drain region 204, and p-type substrate region 206. Control gate 230, which is typically formed from polysilicon, is separated from substrate layer 206 via oxide layer 208, nitride layer 210 and oxide layer 212. In the following, control gate 230 together with oxide layer 208, nitride layer 210 and oxide layer 212 are collectively referred to in the alternative as MNOS gate 235. Guiding gate 220, which is also typically formed from polysilicon, is separated from substrate 206 via layer 214. Layer 214 may be an oxide layer or oxinitride layer or any other dielectric layer. Guiding gate 220 partially extends over control gate 230 and is separated therefrom via oxide layer 232.

In some embodiments, oxide layer 208 has a thickness ranging from 20 Å to 60 Å, and each of nitride layer 210 and oxide layer 212 has a thickness ranging from 30 Å to 10 Å (FIG. 3 is not drawn to scale). In these embodiments, a first portion of channel length defined between the right vertical edge of source region 202 and the right vertical edge of guiding gate 220 that is positioned above gate oxide layer 214—shown as distance $L_1$—is the minimum distance allowed by the manufacturing technology. For example, if device 200 is manufactured using 0.18$\mu$ CMOS technology, distance $L_1$ is also approximately 0.18$\mu$; if device 200 is manufactured using 0.09$\mu$ CMOS technology, distance $L_1$ is also approximately 0.09$\mu$.

Furthermore, in these embodiments, a second portion of channel length defined between the left vertical edge of drain region 204 and the left vertical edge of nitride layer 210 that is positioned above gate oxide layer 208—shown as distance $L_2$—is less than or equal to the minimum distance allowed by the manufacturing technology. For example, if device 200 is manufactured using $0.18\mu$ CMOS technology, distance $L_1$ may vary from, e.g., approximately $0.06\mu$ to approximately $0.18\mu$; if device 200 is manufactured using $0.25\mu$ CMOS technology, distance $L_2$ may vary from, e.g., approximately $0.08\mu$ to approximately $0.25\mu$.

Oxide layer 214 also has a thickness defined by the technology used to manufacture cell 202. For example, oxide layer 214 may have a thickness of 70 Å if $0.35\mu$ CMOS technology is used to manufacture device 200. Similarly, oxide layer 214 may have a thickness of 50 Å if $0.25\mu$ CMOS technology is used to manufacture device 200; oxide layer 214 may have a thickness of 40 Å if $0.18\mu$ CMOS technology is used to manufacture device 200; oxide layer 214 may have a thickness of 20 Å if $0.09\mu$ CMOS technology is used to manufacture device 200.

Figure 4:
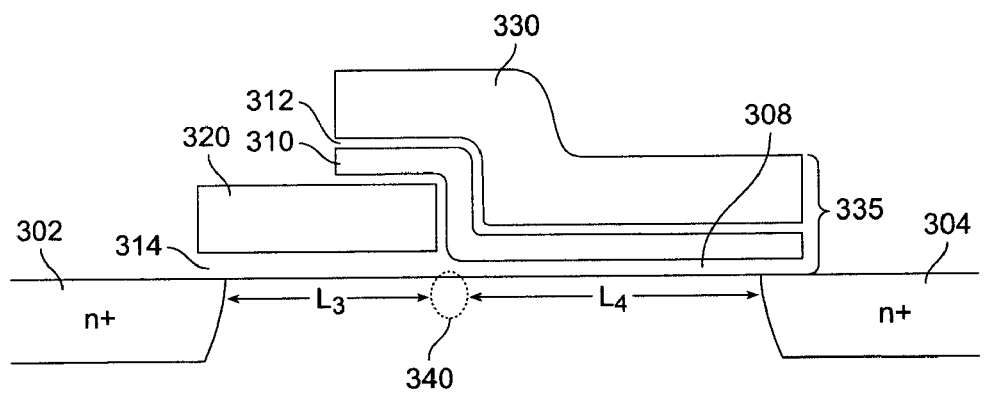
FIG. 4 is a cross-sectional view of a second embodiment of a non-volatile memory device, in accordance with another embodiment of the present invention.

FIG. 4 is a cross-sectional view of non-volatile memory device 300 (hereinafter alternatively referred to as device 300) in accordance with a second embodiment of the present invention. Device 300 includes, in part, a guiding gate 320, a control gate 330, n-type source region 302, n-type drain region 304, and p-type substrate region 306. Control gate 330, which is typically formed from polysilicon, is separated from substrate layer 306 via oxide layer 308, nitride layer 310 and oxide layer 312. In the following, control gate 330 together with oxide layer 308, nitride layer 310 and oxide layer 312 are collectively referred to in the alternative as MNOS gate 335. Guiding gate 320, which is also typically formed from polysilicon, is separated from substrate 306 via oxide layer 314. Guiding gate 320 partially extends over control gate 330 and is separated therefrom via oxide layer 308, nitride layer 310 and oxide layer 312.

In some embodiments, oxide layer 308 has a thickness ranging from 20 Å to 50 Å, and each of nitride layer 310 and oxide layer 312 has a thickness ranging from 30 Å to 100 Å (FIG. 4 is not drawn to scale). In these embodiments, a first portion of channel length defined between the right vertical edge of source region 302 and the right vertical edge of guiding gate 320 that is positioned above gate oxide layer 314—shown as distance $L_3$—is the minimum distance allowed by the manufacturing technology. For example, if device 300 is manufactured using $0.18\mu$ CMOS technology, distance $L_3$ is also approximately $0.18\mu$; if device 300 is manufactured using $0.25\mu$ CMOS technology, distance $L_3$ is also approximately $0.25\mu$.

Furthermore, in these embodiments, a second portion of channel length defined between the left vertical edge of drain region 304 and the left vertical edge of nitride layer 310 that is positioned above gate oxide layer 308—shown as distance $L_4$—is less than or equal to the minimum distance allowed by the manufacturing technology. For example, if device 300 is manufactured using $0.18\mu$ CMOS technology, distance $L_3$ may vary from, e.g., approximately 0.06 $\mu$ to approximately $0.18\mu$; if device 300 is manufactured using $0.25\mu$ CMOS technology, distance $L_4$ may vary from, e.g., approximately $0.08\mu$ to approximately $0.25\mu$.

Oxide layer 314 also has a thickness defined by the technology used to manufacture device 300. For-example, oxide layer 314 may have a thickness of 70 Å if $0.35\mu$ CMOS technology is used to manufacture device 300. Similarly, oxide layer 314 may have a thickness of 50 Å if $0.25\mu$ CMOS technology is used to manufacture device 300; oxide layer 314 may have a thickness of 40 Å if $0.18\mu$ CMOS technology is used to manufacture device 300.

The programming, erase and read operations of device 200 is described below. It is understood that device 300 operates in the same manner as device 200 and thus is not discussed below.

Programming Operation

Figure 5:
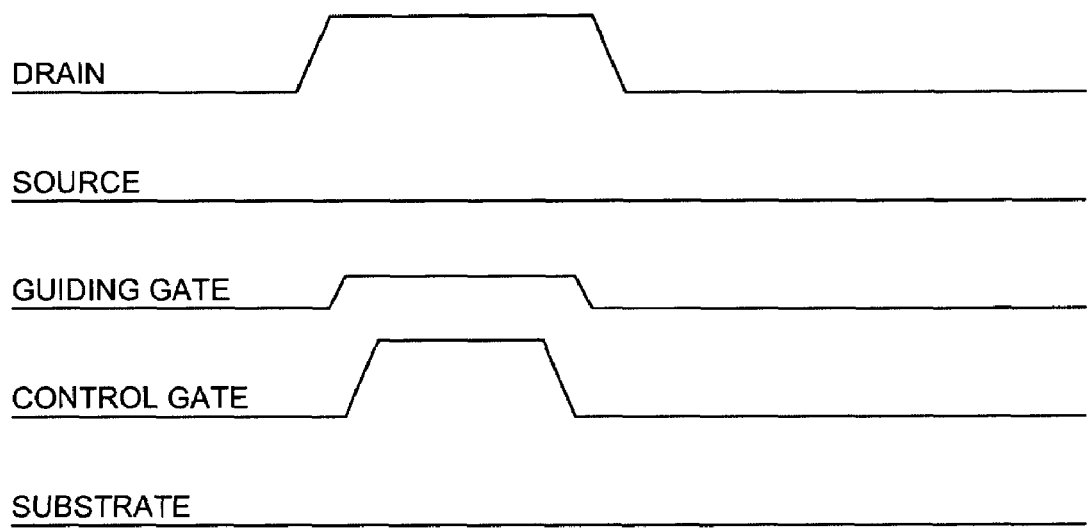
FIG. 5 is an exemplary waveform of the voltages applied to various terminals of the non-volatile memory device of FIGS. 3, 4, during a programming cycle.

To program device 200, a relatively high first programming voltage in the range of, e.g., 4 to 12 volts is applied between gate 230 and substrate 206, while at the same time a second voltage in the range of, e.g., 0.5 to 1.5 volts is applied between gate 220 and substrate 206, and a third voltage in the range of, e.g., 3 to 5 volts is applied between drain 204 and source 202. The application of these voltages causes n-type channel regions of approximate lengths $L_1$ and $L_2$ to be formed in substrate 206 (not shown). As the electrons drift from source 202 to drain 204 due to the established electric filed (not shown), the electrons tunnel through the oxide layer overlaying substrate 206 and are trapped in nitride layer 210 due to hot electron injection. The injected electrons remain trapped in nitride layer 210 even after power is turned off. The trapped electrons, in turn, increase the threshold voltage of device 200. The relatively high electric field in region 240 of substrate 206 is so adapted as to cause the hot electron injection to occur. Subsequently, an n-type channel is also formed in region 240, thereby causing n-type to connect source 202 and drain 204. FIG. 5 is an exemplary waveform of the voltages applied to various terminals of device 200 during a programming cycle, as described above.

Figure 6:
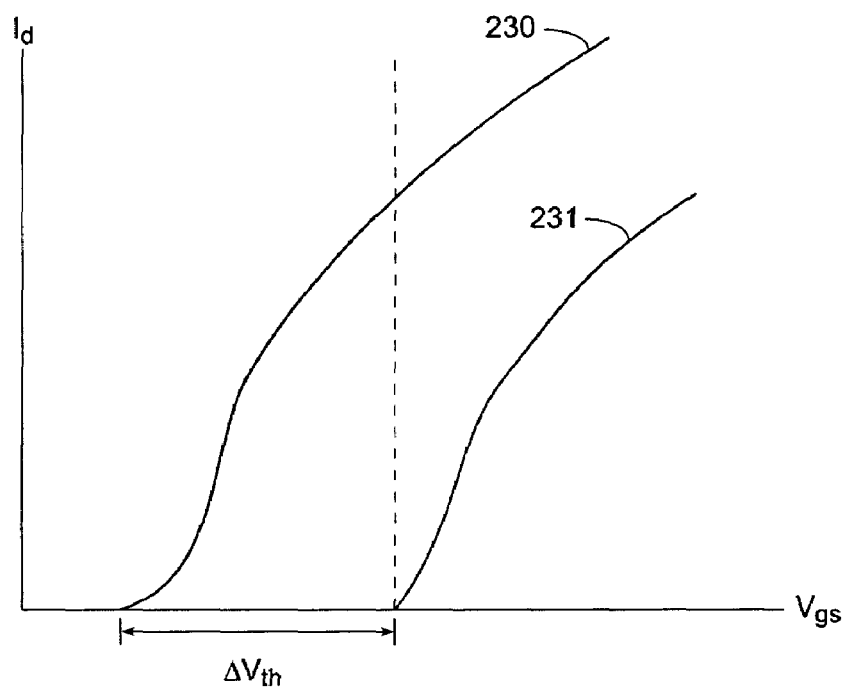
FIG. 6 shows the effect of the increase in the threshold voltage on current conduction characteristics of non-volatile memory devices of FIGS. 3, 4, following a programming cycle.

FIG. 6 shows the effect of the increase in the threshold voltage of device 200's current conduction characteristics. Reference numerals 250 and 255 respectively designate the drain-current vs. gate-voltage of device before and after it is programmed. As seen from FIG. 5, the increase in the threshold voltage $V_{th}$ caused by trapping of the electrons (i.e., the programming of non-volatile device 102) reduces the drain current for each applied voltage. In other words, device 200 conducts less current when it is programmed. The reduction in the current conduction capability is used to determine whether device 200 has been programmed.

Erase Operation

Figure 7:
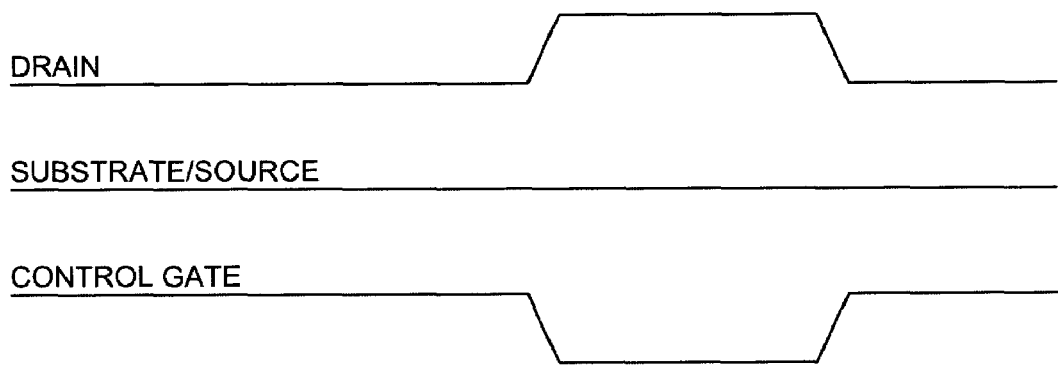
FIG. 7 is an exemplary waveform of the voltages applied to various terminals of the non-volatile memory device of FIGS. 3, 4, during an erase cycle.

To erase a programmed device, a relatively high negative voltage, e.g., −10 volts is applied to gate 230, approximately 0 to 1 volt is applied to drain region 204, approximately 0 volt is applied to substrate region 206, and guiding gate 220 is left floating or is supplied with 0 or −1 volt. The application of these voltages causes the electrons trapped in nitride layer 210 to tunnel through the oxide layer—due to Fowler-Nordheim tunneling—and return to substrate 206 and/or holes to tunnel through the oxide layer overlaying substrate 206 and be trapped in nitride layer 210 due to hot hole injection so as to neutralize the trapped electrons. The tunneling of trapped electrons back to substrate 206 and/or trapping of holes in nitride layer 210 causes the programmed non-volatile cell 102 to erase. The erase operation causes device 200's threshold to retune to its pre-programming value. FIG. 7 is an exemplary waveform of the voltages applied to various terminals of device 200 during an erase cycle, as described above.

A second way to erase non-volatile device 200 is by injecting hot holes into nitride layer 212. To cause hot hole injection, substrate 206 is pulled to the Vss or a negative voltage, e.g., in the range of −1 to −3 volts. Another voltage in the range of, e.g., 0 to −10 volts is applied to control gate 230. Guiding gate 220 is maintained at the ground or a negative potential, e.g., −1 to −3 volts. A positive voltage pulse of magnitude of 3 to 7.5 is applied to drain terminal 204. Accordingly, a strong depletion region is formed between drain region 204 and substrate region 206. This depletion region causes a relatively narrow region having a high electric field across it. Therefore, band-to-band tunneling takes place causing electrons to tunnel from the surface valence band toward the conduction band, thereby generating holes. The holes so generated drift toward the substrate. Some of these holes gain sufficient energy to inject through the oxide and be trapped in the nitride layer. The injected holes neutralize any electrons that are trapped in the nitride layer, thereby causing the threshold voltage of non-volatile device 52 to return to its pre-programmed (i.e., erased) state.

Read Operation

Figure 8:
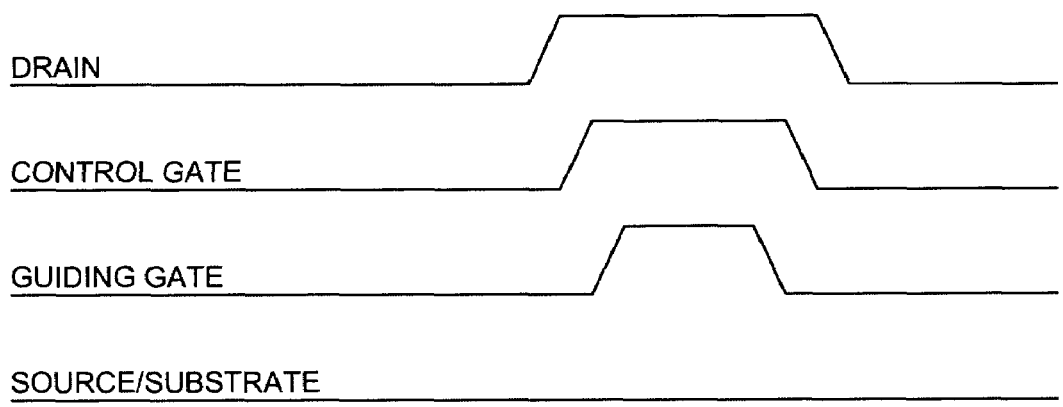
FIG. 8 is an exemplary waveform of the voltages applied to various terminals of the non-volatile memory device of FIGS. 3, 4, during a read cycle.

To read the data stored in non-volatile device 200, a first voltage in the range of, e.g., 1 to 1.5 volts, is applied to drain 204, a second voltage in the range of, e.g., 2 to 3.5 volts is applied to control gate 230, and a third voltage in the range of, e.g., 1 to 3.5 volts is applied to guiding gate 220. The application of these voltages causes a current to flow from source 202 to drain 204. As is known by those skilled in the art, if device 200 is programmed, due to its increased threshold voltage, a relatively small amount or no current flows from source 202 to drain 204. If device 200 is not programmed or erased, a relatively larger amount of current flows from source 202 to drain 204. A sense amplifier (not shown) senses the current that flows from source 202 and drain 204 and by sensing the size of this current determines whether device 200 is programmed or not. FIG. 8 is an exemplary waveform of the voltages applied to various terminals of device 200 during a read cycle, as described above.

The above embodiments of the present invention are illustrative and not limitative. The invention is not limited by the type of integrated circuit in which the memory device of the present invention is disposed. For example, the memory device, in accordance with the present invention, may be disposed in a programmable logic device, a central processing unit, and a memory having arrays of memory cells or any other IC which is adapted to store data.

While the invention is described in conjunction with the preferred embodiments, this description is not intended in any way as a limitation to the scope of the invention. Modifications, changes, and variations, which are apparent to those skilled in the art, can be made in the arrangement, operation and details of construction of the invention disclosed herein without departing from the spirit and scope of the invention.

What is claimed is:

1. A semiconductor device comprising:
   a substrate region;
   a source region formed in the substrate region;
   a drain region formed in the substrate region and separated from the source region by a channel region;
   a first gate overlaying a first portion of the channel and separated therefrom via a first insulating layer; and
   a second gate overlaying a second portion of the channel and separated therefrom via a second insulating layer, wherein said first portion of the channel and said second portion of the channel do not overlap, wherein said first insulating layer is an oxide layer, wherein said second insulating layer further comprises a first oxide layer formed over said channel region, a first nitride layer formed over said first oxide layer of the second insulating layer, and a second oxide layer formed over said first nitride layer, and wherein said first oxide layer of the first insulating layer is thinner than the first oxide layer of the second insulating layer wherein said first gate extends partially over the second gate.

2. A semiconductor device comprising:
   a substrate region;
   a source region formed in the substrate region;
   a drain region formed in the substrate region and separated from the source region by a channel region;
   a first gate overlaying a first portion of the channel and separated therefrom via a first insulating layer; and
   a second gate overlaying a second portion of the channel and separated therefrom via a second insulating layer; wherein said first portion of the channel and said second portion of the channel do not overlap, wherein said first insulating layer is an oxide layer, wherein said second insulating layer further comprises a first oxide layer formed over said channel region, a first nitride layer formed over said first oxide layer of the second insulating layer, and a second oxide layer formed over said first nitride layer, and wherein said first oxide layer of the first insulating layer is thinner than the first oxide layer of the second insulating layer wherein said second gate extends partially over the first gate.

3. The semiconductor device of claim 1 wherein said device is programmed by applying a first voltage between the second gate and the substrate region, a second voltage between the first gate and the substrate region, and a third voltage between the source and the drain regions, said applied voltages causing electrons to be trapped in the nitride layer due to hot electron injection.

4. The semiconductor device of claim 3 wherein said electrons are trapped near the source region of the semiconductor device.

5. The semiconductor device of claim 4 wherein a channel connecting the source region to the drain region is formed in the substrate region while the device is being programmed.

6. The semiconductor device of claim 3 wherein said programmed device is erased by applying a fourth voltage to the second gate, a fifth voltage to the drain region and floating the first gate, said applied voltages causing the electrons trapped in nitride layer to tunnel to the substrate region or causing holes be trapped in the nitride layer to neutralize the trapped electrons.

7. The semiconductor device of claim 3 wherein said programmed device is erased by applying a fourth voltage to the second gate, a fifth voltage to the drain region and applying one of zero and negative voltage to the first gate, said applied voltages causing the electrons trapped in nitride layer to tunnel to the substrate region or causing holes be trapped in the nitride layer to neutralize the trapped electrons.

8. The semiconductor device of claim 2 wherein said device is programmed by applying a first voltage between the second gate and the substrate region, a second voltage between the first gate and the substrate region, and a third voltage between the source and the drain regions, said applied voltages causing electrons to be trapped in the nitride layer due to hot electron injection.

9. The semiconductor device of claim 8 wherein said electrons are trapped near the source region of the semiconductor device.

10. The semiconductor device of claim 9 wherein a channel connecting the source region to the drain region is formed in the substrate region while the device is being programmed.

11. The semiconductor device of claim 8 wherein said programmed device is erased by applying a fourth voltage to the second gate, a fifth voltage to the drain region and floating the first gate, said applied voltages causing the electrons trapped in nitride layer to tunnel to the substrate region or causing holes be trapped in the nitride layer to neutralize the trapped electrons.

12. The semiconductor device of claim 1 wherein said substrate region is a p-type region formed in a n-well region.

* * * * *